(12) United States Patent
Marshall et al.

(10) Patent No.: US 6,311,621 B1
(45) Date of Patent: Nov. 6, 2001

(54) SHOCK-RESISTANT ELECTRONIC CIRCUIT ASSEMBLY

(75) Inventors: Paul N. Marshall, Avon; Thomas C. Tseka, West Suffield; Brendan M. Walsh, Simsbury; James E. Fritz, Ellington, all of CT (US)

(73) Assignee: The Ensign-Bickford Company, Simsbury, CT (US)

( * ) Notice: Subject to any disclaimer, the term of this patent is extended or adjusted under 35 U.S.C. 154(b) by 0 days.

(21) Appl. No.: 09/455,548

(22) Filed: Dec. 6, 1999

Related U.S. Application Data

(63) Continuation-in-part of application No. 08/742,296, filed on Nov. 1, 1996, now Pat. No. 6,079,332.

(51) Int. Cl.[7] ............................. F42C 19/08; F42C 19/12
(52) U.S. Cl. .................................. 102/202.5; 102/202.14
(58) Field of Search ........................... 102/202.5, 202.7, 102/202.12, 202.14; 174/52.5; 257/723, 685

(56) References Cited

U.S. PATENT DOCUMENTS

| | | |
|---|---|---|
| 3,566,003 | 2/1971 | Wislocky ........................ 174/52 |
| 3,581,883 | 6/1971 | Whitney ......................... 206/46 |
| 3,612,749 | 10/1971 | Grube, Jr. et al. ............. 174/138 G |
| 3,756,157 | 9/1973 | England et al. ................ 102/70.2 R |
| 3,757,695 | 9/1973 | Fisher ........................... 102/70.2 G |
| 3,885,223 | 5/1975 | Green ............................ 337/406 |
| 3,909,504 | 9/1975 | Browne .......................... 174/52 PE |
| 3,956,672 | 5/1976 | Dumas ........................... 317/99 |
| 3,981,240 * | 9/1976 | Gladden ......................... 102/29 |
| 3,987,732 | 10/1976 | Spraggs et al. ................. 102/27 R |
| 4,037,538 | 7/1977 | Andrews et al. ................ 102/23 |
| 4,118,861 | 10/1978 | Palmisano ....................... 29/631 |
| 4,132,171 | 1/1979 | Pawlak et al. .................. 102/28 R |
| 4,164,619 | 8/1979 | Sprengling et al. .............. 174/52 PE |
| 4,220,088 | 9/1980 | Kimura et al. .................. 102/28 R |
| 4,316,412 | 2/1982 | Dinegar et al. ................. 102/205.5 |
| 4,369,708 | 1/1983 | Bryan et al. .................... 102/202.13 |

(List continued on next page.)

OTHER PUBLICATIONS

Definition for "boss"; American Heritage Dicitionary, 1976.
Definition for "polyethylene"; Condensed Chemical Dictionary; Van Nostrand Reinhold Co., 1971.
Definition for "silicon"; Condensed Chemical Dictionary; Van Nostrand Reinhold Co., 1971.
Definitions for "encapsulate" and "encase"; Webster's New Riverside University Dictionary, 1994.

Primary Examiner—Charles T. Jordan
Assistant Examiner—Lulit Semunegus
(74) Attorney, Agent, or Firm—Libert & Associates; Frederick A. Spaeth

(57) ABSTRACT

A shock-resistant electronic circuit assembly (10) is provided in which an electronic circuit is encased in an encapsulation (14) that engages a surrounding enclosure (18) in shock-dispersing contact therewith. The encapsulation may have a plurality of edges (16, 16a, 16b), fins (24) or bosses (70) that bear against the enclosure. The encapsulation may include a shock-absorbing material (14f) disposed against the enclosure to protect the circuit against vibrations and a structural support material such as a casing (14e) to protect the circuit against stress. The circuit assembly (10) may be part of a sheathed initiator assembly (55) that includes a transfer member (58) for converting shock wave energy into electrical energy for the electronic circuit, and the released energy may be converted into a detonation initiation signal. Assembly (55) may be part of a detonator (100) that receives a non-electric initiation signal and detonates following the delay determined by the electronic circuit. The detonator housing (112) or an optional sleeve (22) provides an enclosure for the assembly (55). The circuit encapsulation may include one or more bushings such as O-rings (14g, 14g') disposed about the circuit casing (14e).

27 Claims, 9 Drawing Sheets

U.S. PATENT DOCUMENTS

| | | | |
|---|---|---|---|
| 4,400,858 | 8/1983 | Goiffon et al. | 24/255 BS |
| 4,480,148 | 10/1984 | Archer | 174/51 |
| 4,567,545 | 1/1986 | Mettler, Jr. | 361/401 |
| 4,586,436 | 5/1986 | Denney et al. | 102/206 |
| 4,600,969 | 7/1986 | Hendrickson | 361/395 |
| 4,600,971 | 7/1986 | Rose et al. | 361/421 |
| 4,607,573 | 8/1986 | Thureson et al. | 102/275.8 |
| 4,656,442 | 4/1987 | Hayakawa | 333/140 |
| 4,676,165 | 6/1987 | Gordon et al. | 102/251 |
| 4,685,303 | 8/1987 | Branc et al. | 62/3 |
| 4,708,060 | 11/1987 | Bickes, Jr. et al. | 102/202.7 |
| 4,712,477 | 12/1987 | Aikou et al. | 102/206 |
| 4,727,808 * | 3/1988 | Wang et al. | 102/202.5 |
| 4,763,188 | 8/1988 | Johnson | 357/74 |
| 4,825,765 | 5/1989 | Ochi et al. | 102/206 |
| 4,831,932 | 5/1989 | Bayerkohler et al. | 102/202.5 |
| 4,852,493 | 8/1989 | Boberg et al. | 102/202.5 |
| 4,869,170 * | 9/1989 | Dahmberg et al. | 102/202.5 |
| 4,891,734 | 1/1990 | More et al. | 361/417 |
| 4,933,744 | 6/1990 | Segawa et al. | 357/72 |
| 4,976,200 | 12/1990 | Benson et al. | 102/202.7 |
| 5,003,879 | 4/1991 | Jones | 102/204 |
| 5,015,801 | 5/1991 | Schaller et al. | 174/52.2 |
| 5,031,538 * | 7/1991 | Dufrane et al. | 102/275.5 |
| 5,052,301 * | 10/1991 | Walker | 102/202.7 |
| 5,059,746 | 10/1991 | Hayes et al. | 174/52.1 |
| 5,105,742 | 4/1992 | Sumner | 102/312 |
| 5,111,364 | 5/1992 | Yoshimoto | 361/399 |
| 5,133,257 | 7/1992 | Jonsson | 102/210 |
| 5,173,569 | 12/1992 | Pallanck et al. | 102/210 |
| 5,175,613 | 12/1992 | Barker, III et al. | 257/713 |
| 5,285,559 | 2/1994 | Thompson et al. | 29/841 |
| 5,293,002 | 3/1994 | Grenet et al. | 174/52.2 |
| 5,295,045 | 3/1994 | Kitano et al. | 361/813 |
| 5,319,522 | 6/1994 | Mehta | 361/748 |
| 5,323,150 | 6/1994 | Tuttle | 340/825.54 |
| 5,370,053 | 12/1994 | Williams et al. | 102/202.5 |
| 5,377,592 * | 1/1995 | Rode et al. | 102/210 |
| 5,431,101 * | 7/1995 | Arrell, Jr. et al. | 102/202.5 |
| 5,433,147 | 7/1995 | Brede et al. | 102/202.2 |
| 5,435,248 | 7/1995 | Rode et al. | 102/210 |
| 5,488,908 | 2/1996 | Gilpin et al. | 102/200 |
| 5,491,608 | 2/1996 | Koyanagi et al. | 361/685 |
| 5,522,318 | 6/1996 | Gladden et al. | 102/202.13 |
| 5,535,092 | 7/1996 | Bang | 361/685 |
| 5,568,357 | 10/1996 | Kochis et al. | 361/681 |
| 5,585,591 | 12/1996 | Waldock | 102/202.12 |
| 5,589,657 | 12/1996 | Gessel et al. | 102/202.14 |
| 5,595,319 | 1/1997 | Householder et al. | 220/429 |
| 5,675,120 | 10/1997 | Craft et al. | 174/52.1 |
| 5,756,926 | 5/1998 | Bonbrake et al. | 102/215 |
| 5,763,816 | 6/1998 | Keeling | 102/322 |
| 5,770,941 | 6/1998 | Van Den Berg | 324/207.16 |
| 5,837,925 | 11/1998 | Nice | 102/310 |

* cited by examiner

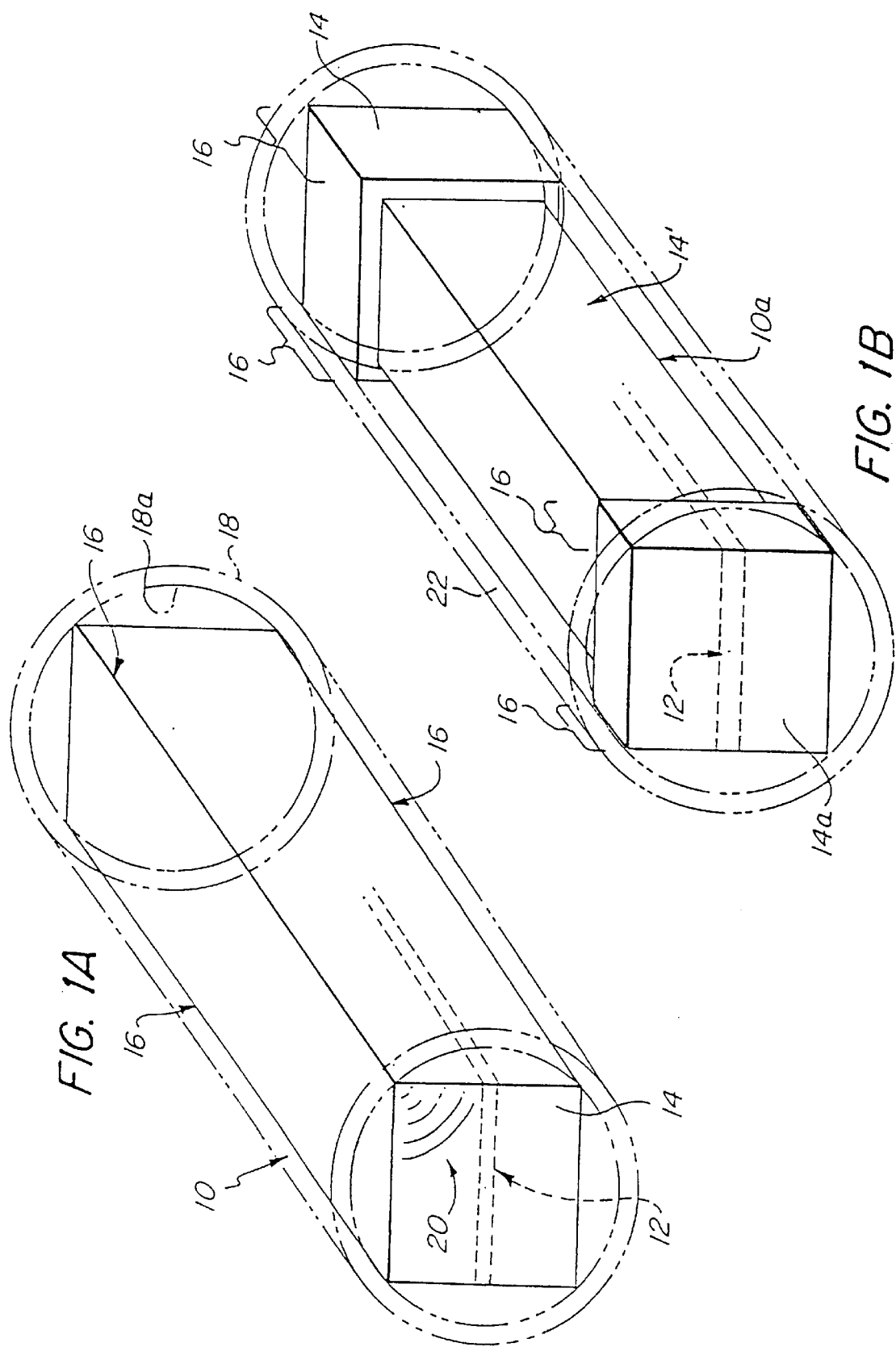

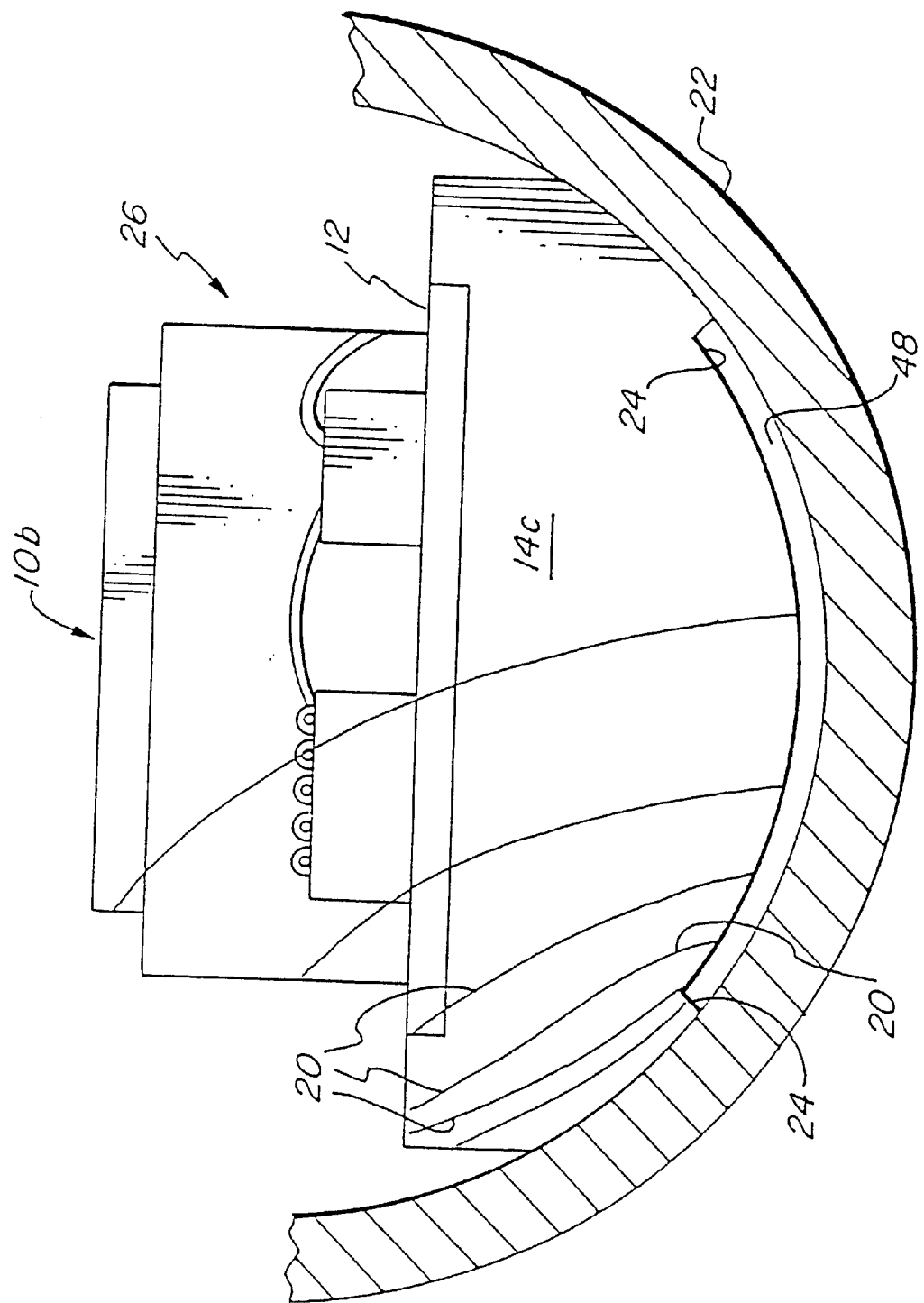

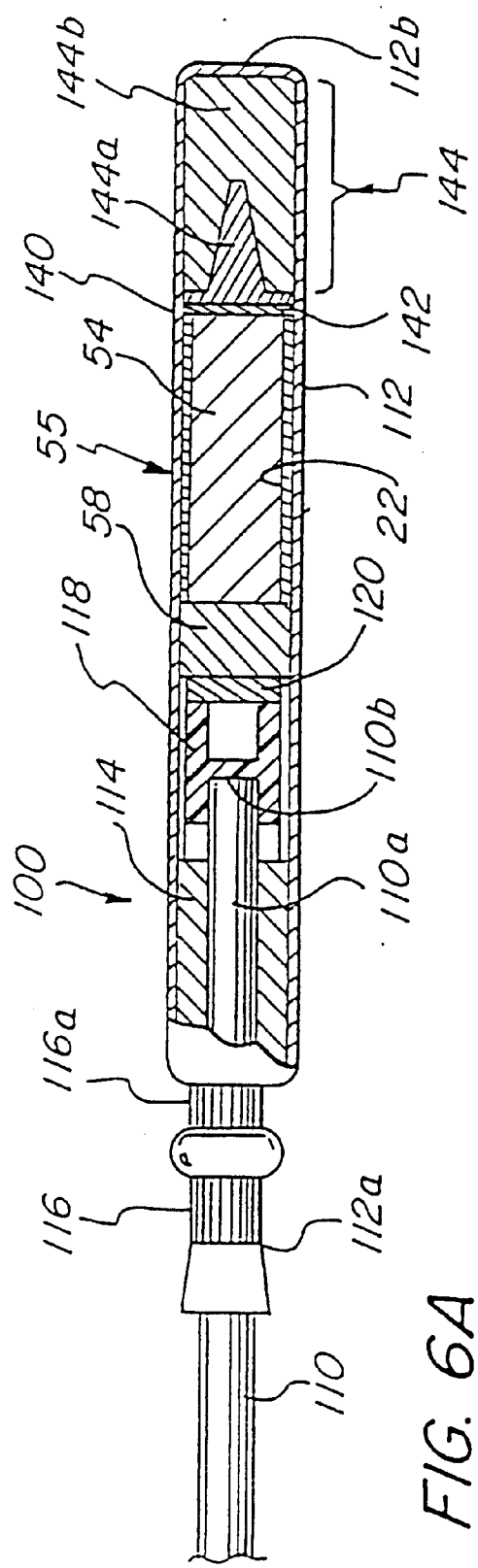
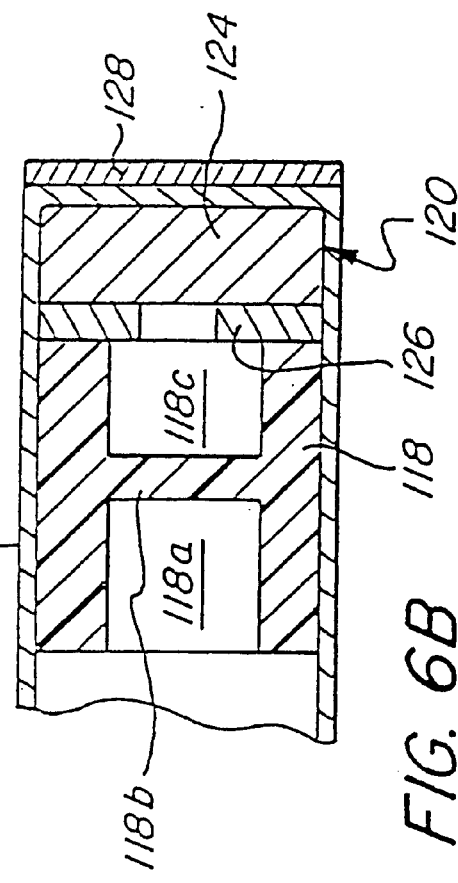
FIG. 6A
FIG. 6B

SHOCK-RESISTANT ELECTRONIC CIRCUIT ASSEMBLY

CROSS REFERENCE TO RELATED APPLICATIONS

This application is a continuation-in-part of U.S. patent application Ser. No. 08/742,296, filed Nov. 1, 1996, now U.S. Pat. No. 6,079,332, issued on Jun. 27, 2000, entitled "Shock Resistant Electronic Circuit Assembly."

BACKGROUND OF THE INVENTION

1. Field of the Invention

This invention relates to encapsulated electronic circuits and, in particular, to shock-resistant electronic circuit assemblies that find use in blasting components.

2. Related Art

Electronic timing circuits for firing detonators after a predetermined, electronically-controlled delay period are known. The delay period is measured from the receipt of an initiation signal that may provide power for the timing circuit. Thus, U.S. Pat. No. 5,133,257 to Jonsson, issued Jul. 28, 1992, discloses an ignition system comprising a piezoelectric transducer that can be disposed next to a detonating cord branch line. When the detonating cord detonates, a shock wave is imposed on the piezoelectric transducer which then produces an electrical pulse. The electrical energy from the transducer is stored in a capacitor which provides power for a timer. After a predetermined delay, the timer allows the remaining stored energy in the capacitor to fire an ignition head in the detonator. The ignition head initiates explosive material, thus providing the explosive output for the detonator. Electronic delay circuits may also be used to initiate bridge elements such as a semiconductor bridge as described, e.g., in U.S. Pat. No. 4,708,060 to Bickes, Jr. et al, issued Nov. 24, 1987, or a tungsten bridge as described, e.g., in U.S. Pat. No. 4,976,200 to Benson et al, issued Dec. 11, 1990. Other electronic delay circuits are seen in U.S. Pat. No. 5,173,569 to Pallanck et al, issued Dec. 22, 1992; in U.S. Pat. No. 5,377,592 to Rode et al, issued Jan. 3, 1995; and in U.S. Pat. No. 5,435,248 to Rode et al, issued Jul. 25, 1995. These patents generally suggest that the electronic circuitry be molded within a suitable plastic package, casing or "potting compound". See, e.g., the Jonsson Patent at column 2, lines 42–50; the Pallanck et al Patent at column 3, lines 32–35; the Rode et al Patent (U.S. Pat No. 5,377,592) at column 9, lines 30–33 and the Rode et al Patent (U.S. Pat. No. 5,435,248) at column 7, lines 9–13. The stated purpose for such enclosures is to protect the electronic components and minimize the chances of detonation or damage by mechanical impact. No particular configuration or material for such casings is disclosed in these patents.

U.S. Pat. No. 4,869,170 to Dahmberg et al, issued Sep. 26, 1989, discloses a detonator comprising a circuit encased in an encapsulation (70) within an elongate enclosure. The encapsulation extends along only a portion of the length of the enclosure, but where the encapsulation is co-extensive with the enclosure, it appears to make full contact with the longitudinal interior surface of the enclosure, i.e., there are no gaps between the encapsulation and the enclosure.

U.S. Pat. No. 4,118,861 to Palmisano, issued Oct. 10, 1978, discloses the use of a plurality of loose pellets used as packing material for a circuit board in an enclosure.

U.S. Pat. No. 4,712,477 to Aikou et al, issued Dec. 15, 1987, discloses an electronic delay detonator in which a delay circuit is suspended in a plastic casing by a plastic plug. The use of a plastic casing and the absence of an encapsulation about the delay circuit indicates that the disclosed detonator is vulnerable to lesser external forces than could be withstood by a conventional detonator having a metal housing.

U.S. Pat. No. 5,589,657 to Gessel et al, issued Dec. 31, 1996, discloses a detonating apparatus comprising a conventional electronic delay detonator (1) placed in a glass Dewar vessel (3). The Dewar vessel is mounted within a sheath (4) by elastomeric plugs (5, 10) at either end. The plugs extend beyond the ends of the Dewar vessel. No part of either plug is disposed between the detonator and the longitudinal, cylindrical internal surface of the sheath.

U.S. Pat. No. 4,656,442 to Hayakawa, issued Apr. 7, 1987, discloses an integrated circuit package comprising various discrete circuit elements encased in an encapsulation with only input and output leads protruding from the encapsulation.

U.S. Pat. No. 4,400,858 to Goiffon et al, issued Aug. 30, 1983, discloses a downhole electric plug comprising a circuit board suspended in a tube that constitutes the enclosure for the circuit. The circuit on the circuit board emits signals as part of a radio telemetry system. The circuit board is suspended by metallic spring clips mounted periodically along the board. The circuit generates heat during its operation and the spring clips serve as heat sinks. There is no casing about the circuit board between the circuit board and the enclosure, none of the clips encases the circuit and each clip makes substantially full circumferential contact in the regions where the clip is axially co-extensive with the surrounding tube.

The substance of U.S. patent application Ser. No. 08/742,296, filed Nov. 1, 1996, which is a parent of this continuation-in-part application, is contained in South African patent application No. 97/9757, which was laid open for inspection May 1, 1998.

SUMMARY OF THE INVENTION

The present invention provides a sheathed electronic circuit assembly comprising an electronic circuit encased in an encapsulation and disposed within an elongate enclosure having a longitudinally-extending interior surface, wherein the encapsulation is dimensioned and configured for limited axial contact with the longitudinally-extending interior surface.

According to one aspect of the invention, the enclosure may comprise a metal sleeve.

According to another aspect of the invention, the circuit may comprise input and output leads that protrude from the encapsulation, and the assembly may further comprise a transfer member at one end of the enclosure. The encapsulation may optionally comprise a casing that encases the circuit and at least one bushing that contacts the longitudinal interior surface of the enclosure and which occupies less than fifty percent of the axial length of the casing. The encapsulation may optionally comprise two or more bushings. In a particular embodiment, the bushing may comprise an O-ring. The circuit assembly may have an input end and an output end and one bushing may be disposed proximate to the input end and another bushing may be disposed proximate to the output end.

In a particular embodiment, the encapsulation may be configured to define a plurality of radially-protruding bosses formed integrally therewith.

The present invention also provides, in one embodiment, an initiator assembly comprising an elongate, open-ended enclosure having a longitudinal interior surface and an initiation module comprising a circuit assembly with an initiation output cap secured thereto. The initiation output cap comprises an electrical initiation element and an initiation charge in a cap that is secured to the circuit assembly. The circuit assembly further comprises a circuit encased within an encapsulation which is disposed within the enclosure, the circuit having input leads that protrude from the encapsulation for receiving an electric initiation signal and output leads connected to the electrical initiation element in the initiation cap. The circuit is configured to initiate the initiation output cap in response to an electric initiation signal received at the input leads. The encapsulation comprises at least one elastic bushing occupying less than one-half of the axial length of the encapsulation, the bushing being positioned and configured to contact the interior surface of the enclosure and to have a periphery that exceeds the axial profile of the remainder of the initiation module so that the circuit encapsulation has a non-conforming configuration relative to the interior surface of the enclosure.

Optionally, the initiator assembly may further comprising a transfer member comprising a body portion and transfer leads for delivering an initiation signal through the body portion to the transfer leads, the transfer member being coupled to the enclosure with the transfer leads extending therein and being connected to the circuit input lead, wherein the bushing and the transfer leads cooperate to position the circuit assembly in the sleeve without contact between the circuit casing and the interior sleeve surface. The bushing may occupy less than one-quarter of the axial length of the circuit assembly.

Optionally, the encapsulation may comprise two or more bushings, e.g., two or more O-rings, that together occupy less than one-half of the axial length of the encapsulation. According to a particular aspect of the invention, the initiation module may have a first end from which the input leads protrude and a second end at the initiation cap, and one or more bushings may reside entirely between the first end and the second end of the initiation module. Optionally, the circuit assembly may comprise a first end and a second end and one or more bushings may reside entirely between the first and second ends of the circuit assembly.

In various particular embodiments, the transfer member may comprise a transducer that converts a physical impulse into an electrical signal at the transfer leads, the sleeve may comprise a metal sleeve, and/or a bushing may comprise an O-ring. The initiation module may optionally define one or more neck regions wherein one or more O-rings are seated. In a particular embodiment, an O-ring may comprise a polymeric material having a durometer in the range of from about 40 to 70. Preferably, the sleeve comprises a metal sleeve and is configured to withstand a lateral pressure of at least 10,000 pounds per square inch (psi).

In a particular embodiment, this invention may provide a sheathed initiator assembly comprising an open-ended hardened steel sleeve having an interior sleeve surface and a sleeve axis therein, a transducer member comprising a transducer body and transfer leads for receiving a physical impulse and generating an electrical signal at the transfer leads, the transducer member being coupled to one end of the sleeve with the transfer leads extending into the sleeve. This initiator assembly further comprises an initiation module comprising a circuit assembly with an initiation output cap secured thereto, the initiation output cap comprising an electrical initiation element and an initiation charge in a cap that is secured to the circuit assembly. The circuit assembly may comprise a circuit in an encapsulation comprising a circuit casing and at least one resilient O-ring formed of a polymeric material configured for contact with the interior sleeve surface so that the bushing and the transfer leads cooperate to position the circuit assembly centrally in the sleeve without contact by the circuit casing with the interior sleeve surface. The circuit may comprise a storage element and timed switching circuitry and having input leads protruding from the encapsulation for connection to the transfer leads for conveying an electric initiation signal from the transfer leads to the circuitry, and may further comprise output leads to which the electric initiation element is connected.

In another particular embodiment of this invention, a shock-resistant electronic circuit assembly may comprise an electronic circuit encased in an encapsulation that is dimensioned and configured to define a plurality of bosses integral therewith that protrude from an otherwise cylindrical exterior surface.

BRIEF DESCRIPTION OF THE DRAWINGS

FIG. 1A is a schematic axonometric view of encapsulated circuitry or "encapsulated module" in a surrounding enclosure shown in dotted outline in accordance with one embodiment of the present invention;

FIG. 1B is a view similar to FIG. 1A of an initiation module and enclosure in accordance with a different embodiment of the present invention;

FIG. 2C is a partial, schematic, cross-sectional view of the initiation module of FIGS. 2A and 2B disposed within a sleeve;

FIG. 6A is a schematic, partly cross-sectional view showing a delay detonator comprising an encapsulated electronic circuit in accordance with one embodiment of the present invention; and FIG. 6B is a view, enlarged relative to FIG. 6A, of the isolation cup and booster charge components of the detonator of FIG. 6A.

DETAILED DESCRIPTION OF THE INVENTION AND PREFERRED EMBODIMENTS THEREOF

Figure 2A:
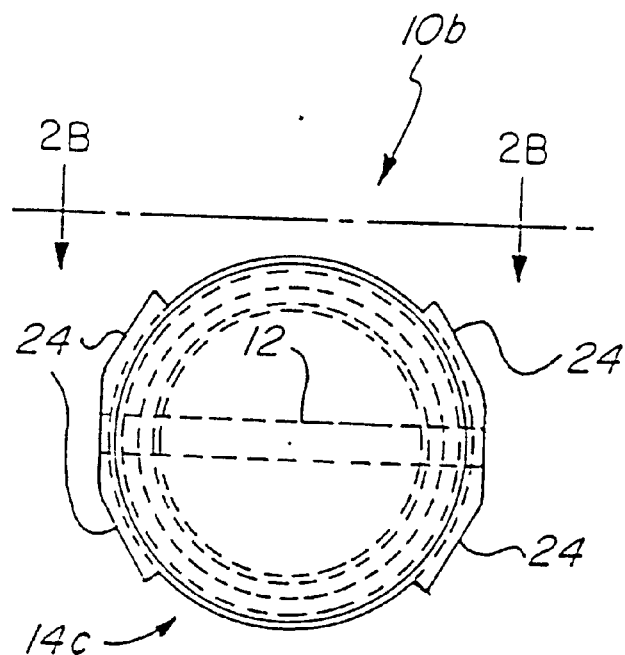
FIG. 2A is a schematic elevational view of an initiation module in accordance with yet another embodiment of the present invention.

The present invention relates to protective encapsulations for electronic circuits to be disposed in rigid surrounding enclosures such as sleeves or shells. According to the present invention, part or all of an encapsulation may be configured as an integral structure molded about the circuit prior to positioning the circuit in the enclosure. Preferably, the encapsulation encases the circuit to protect the circuit from environmental damage, leaving external access only for input/output leads, e.g., for programming, testing and using the circuit. Thus, the preferred encapsulation protects the circuit elements from airborne contaminants at all times. It also protects the circuit after it is in the enclosure by attenuating shock waves received by the enclosure that might otherwise cause stress that causes damage to the circuit particularly, it is believed, at junctions between circuit structures and interfaces of materials of differing densities. The encapsulation also protects the circuit by preventing the circuit from colliding against the enclosure.

An encapsulation according to the present invention may comprise material that attenuates shock waves received through the enclosure and/or it may be physically configured relative to the enclosure to attenuate shock waves. For example, the encapsulation may be physically configured so that, when it is disposed in the enclosure, there is limited contact between the encapsulation and the enclosure. In a typical embodiment, the enclosure has an elongate configuration having a central longitudinal axis and has a longitudinal interior surface that extends axially along its length and that generally faces inward, towards the central axis. The circuit encapsulation may therefore be configured so that there is contact between the encapsulation and the longitudinal interior surface of the enclosure in the axial regions where the encapsulation is axially co-extensive with the enclosure, but also so that there is a gap between them. Preferably, less than 50 percent of the interior surface in this region is in contact with the encapsulation. An encapsulation configured in this way is sometimes described herein as having a "non-conforming" configuration relative to the enclosure, and/or as establishing "limited axial contact" with the enclosure.

The areas of contact between the enclosure and a non-conforming encapsulation therein prevent the circuit from striking the longitudinal interior surface of the enclosure as the result of vibrations or short-term accelerations. In addition, shock waves received from the enclosure become attenuated before they reach the circuit within because the shock waves can only reach the circuit through the areas of contact with the enclosure. The remainder of the encapsulation diffuses the shock wave and thus protects the circuitry within.

Optionally, the encapsulation may comprise a shock-diminishing (or "vibration decoupling" ) material that impedes the transmission of shock waves and vibrations from the enclosure regardless of the degree of contact between the encapsulation and the enclosure, i.e., regardless of the configuration of the enclosure. Thus, this invention may encompass the use of an encapsulation configured to make full contact with the longitudinal interior surface of the enclosure in the region in which it is axially co-extensive (a configuration referred to herein as a "conforming" configuration relative to the enclosure, and/or as establishing "full axial contact" with the enclosure), provided it comprises a decoupling material. Preferably, the vibration decoupling material is in direct contact with the longitudinal interior surface of the enclosure.

Optionally, an encapsulation according to the present invention may have both of the above-described features, i.e., it may be physically configured for limited axial contact with an enclosure and it may also comprise a vibration decoupling material.

In particular embodiments of the invention, the encapsulation may be sufficiently rigid to protect the circuit against damage from inadvertent bending such as might otherwise occur during the manufacture of a device comprising the circuit or as a result of a shock-induced acceleration of the circuit within an enclosure in a direction that is not parallel to the axis of the enclosure. In other words, the encapsulation may provide structural support for the circuit. A structural support material may not serve adequately as a vibration decoupling material. In accordance with this invention, therefore, an encapsulation comprising a structural support material may either have a non-conforming configuration relative to the enclosure or it may comprise a vibration decoupling material in addition to the structural support material. The density and, preferably, the hardness of a decoupling material is typically lower than the densities and hardnesses of the structural support material and the enclosure engaged by the encapsulation. The density of the decoupling material is preferably at least 20 percent less than the density of the structural support material and is preferably in the range of 20 to 60 percent less, although in some cases decoupling materials of even lesser relative densities may be used.

The invention finds utility in protecting any circuit disposed in an elongate rigid enclosure that may be subjected to physical vibrations or shock waves, but is preferably used to protect the electronic circuit of an electronically-controlled detonator disposed in a blast site borehole to initiate a borehole charge. Detonators made with encapsulated electronic circuit assemblies in accordance with the present invention are less likely to be damaged by vibrations from the prior detonation of neighboring charges or the crush of rock broken by other devices, and will therefore detonate more consistently at the appropriate times than prior art detonators.

The enclosure provided by a typical detonator comprises an elongate cylindrical housing or shell that provides a cylindrical, axially-extending longitudinal interior surface. Detonator shells are typically formed from a metal such as aluminum or steel. A non-conforming encapsulation for such an enclosure, i.e., one that is physically configured for limited axial contact with a substantially cylindrical interior surface of the enclosure, has what is also referred to herein as a "non-cylindrical" configuration.

Typically, an electronic detonator timing circuit comprises various integrated and discrete circuit elements including a storage means such as a capacitor which receives and stores an electrical initiation signal. The delay circuit generally includes an electronic switching circuit that can, upon receipt of a firing signal from a timer circuit, discharge the capacitor to an output terminal to which an electric initiation element such as a hotwire, bridgewire or semiconductor bridge may be connected to the circuit, typically from outside of the casing or encapsulation. The firing signal is provided by a timer circuit following a predetermined delay interval measured from the receipt of the electrical initiation signal. Generally, at least the timer circuit is manufactured as an integrated circuit, and the timer circuit is used in conjunction with certain other, discrete circuit elements. The electronic circuit is typically assembled by disposing the circuit elements on a small portion of printed circuit board that provides the necessary electrical connections between them, using so-called surface mount technology. Alternatively, the circuit elements may be mounted on a lattice-like lead frame that supports some of the connections between them. The encapsulation is molded around and encases the assembled circuit except for input, output and testing leads and the electric initiation element, but otherwise preferably encases all the circuit elements of the detonator circuit.

There is shown in FIG. 1A an encapsulated electronic circuit assembly in accordance with one embodiment of the present invention, in which the encapsulation is dimensioned and configured for limited axial contact with a surrounding elongate enclosure. Circuit assembly 10 (sometimes referred to herein as an "initiation module" ) comprises electronic circuit elements (not shown) mounted on a carrier 12 (e.g., a printed circuit board, lead frame, or the like), which is indicated in dotted outline. Circuit assembly 10 also comprises an elongate, generally rectangular encapsulation 14 within which the circuit elements and carrier are encased. Due to its polygonal, i.e., rectangular, cross-sectional configuration (viewed perpendicularly to the longitudinal axis), encapsulation 14 has a non-conforming configuration relative to the tubular enclosure 18 within which it is disposed. Specifically, encapsulation 14 defines a plurality of longitudinally-extending edges 16 that bear against the cylindrical, longitudinally-extending interior surface of the surrounding enclosure 18, shown in dotted outline. Between edges 16, the flat surfaces of the encapsulation are generally distanced from the enclosure, forming axially-extending gaps therebetween where the two are axially co-extensive. Due to the limited co-axial contact between encapsulation 14 and the interior surface 18a of the enclosure that results from the non-conforming configuration of the encapsulation, a shock wave received by enclosure 18 can only impinge on the electronic circuit elements after being dissipated by the encapsulation from the point of contact, e.g., from edge 16, as suggested by dissipation wave lines 20. Preferably, encapsulation 14 is configured so that the points of contact through which shock waves may be received propagate the shock waves at an oblique angle relative to carrier 12 or to the mounting surfaces of a lead frame in the encapsulation.

In an alternative non-conforming configuration shown in FIG. 1B, a circuit assembly 10a in accordance with the present invention is disposed within an enclosure comprising an open-ended sleeve 22. Carrier 12 of the circuit assembly 10a is disposed in a generally rectangular encapsulation 14', but only the edges of portions 14a, 14b at opposite ends of the encapsulation 14' are dimensioned and configured to engage the interior surface of sleeve 22. Thus, a generally toroidal gap is established between the encapsulation and the interior surface of sleeve 22, and the circuit assembly 10a is centrally disposed within sleeve 22 by supporting structures at opposite ends thereof.

Figure 2B:
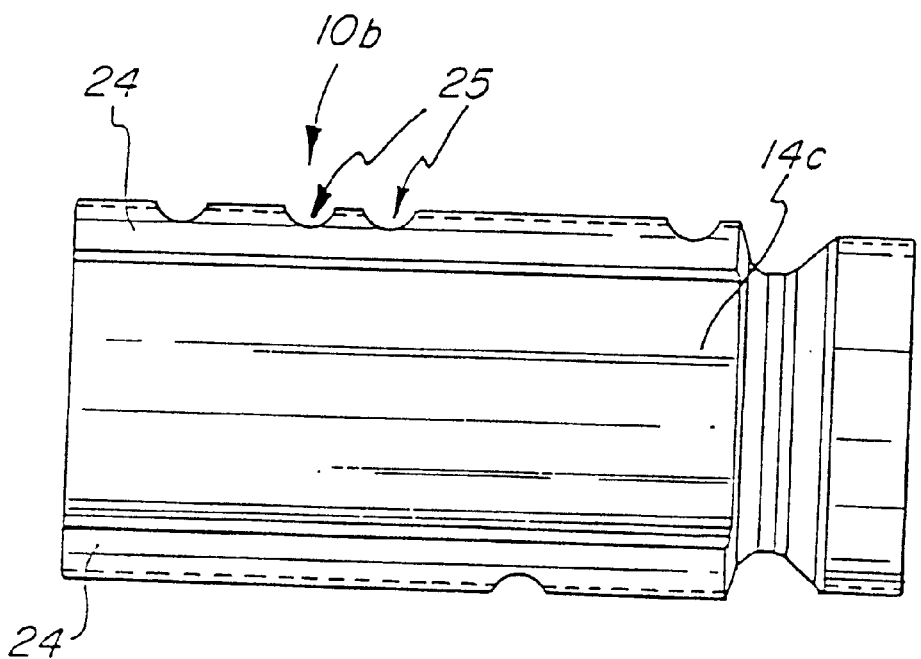
FIG. 2B is a view of the initiation module of FIG. 2A viewed along lines 2B—2B.

Another embodiment of the present invention is seen in FIGS. 2A and 2B, which show that circuit assembly 10b comprises an encapsulation 14c that is configured to have a plurality of longitudinally-extending contact pads or fins 24 that extend beyond the otherwise circular periphery of encapsulation 14c. As seen in FIG. 2B, encapsulation 14c is also configured to have scallops 25 formed therein. As will be explained further below, scallops 25 allow electrical test contacts or "leads" for the electronic circuits or chips within encapsulation 14c to be exposed while allowing the contacts to remain within the profile of the encapsulation. In this way, the electrical contacts are accessible but do not interfere with positioning or suspending the encapsulated circuitry within the surrounding structure. Circuit assembly 10b is designed so that output leads 57 (FIG. 4) and initiation input leads 56 (FIG. 3A) protrude axially from respective opposite ends of encapsulation 14c for connection to other devices, as described below.

FIG. 2C provides a view showing how encapsulation 14c has a non-conforming configuration relative to a surrounding enclosure structure having a cylindrical interior surface, such as sleeve 22. Fins 24 create a gap 48 between a significant portion of encapsulation 14c and the axially co-extensive portion of the longitudinal, axially-extending interior surface of sleeve 22, thus establishing limited axial contact therewith. Gap 48 extends axially between axial regions of contact of fins 24 with sleeve 22. Dissipation waves 20 illustrate how fins 24 dissipate shock waves received from sleeve 22. A portion of encapsulation 14c is omitted from FIG. 2C so that miscellaneous electronic components 26 and carrier 12 of the circuit therein can be seen.

Figure 3A:
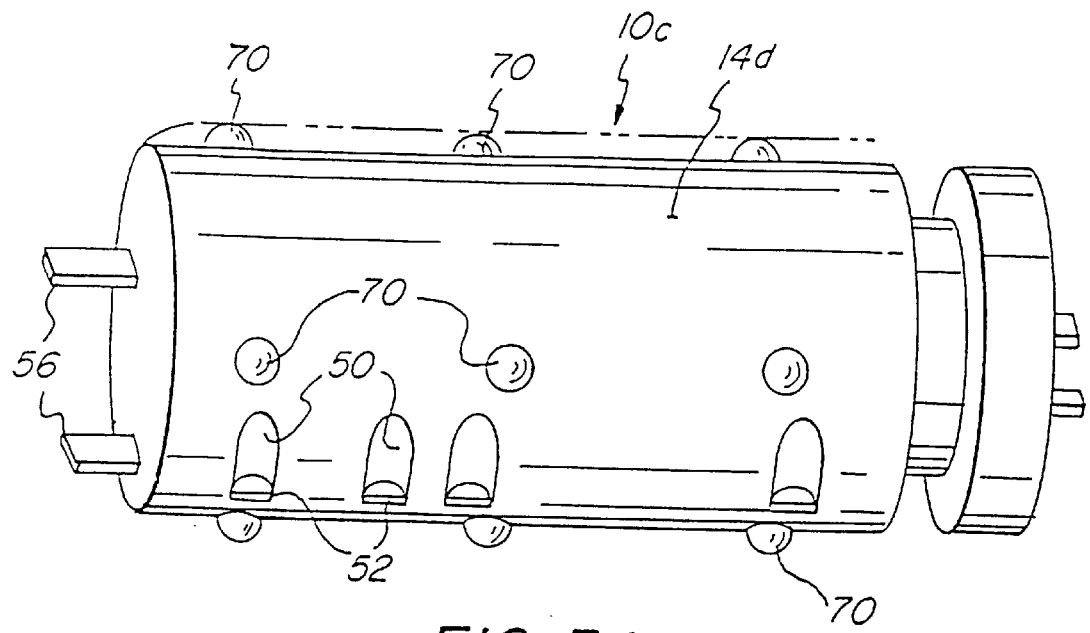
FIG. 3A is a perspective view of an initiation module in accordance with yet another embodiment of the present invention.
Figure 3B:
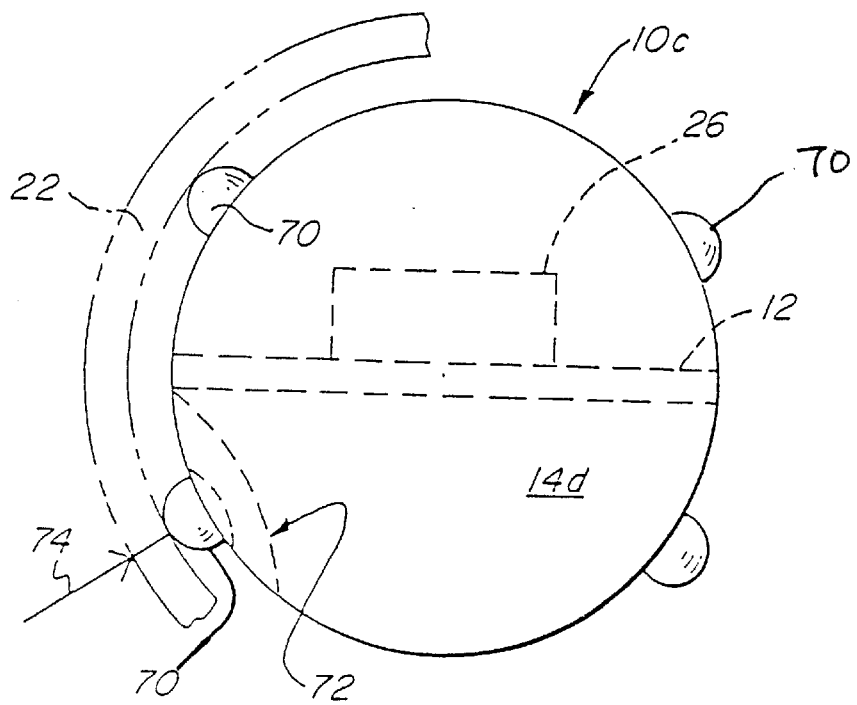
FIG. 3B is a schematic cross-sectional view of the initiation module of FIG. 3A, and an enclosure, illustrating protuberant bosses engaging the enclosure.

Yet another limited contact embodiment of an encapsulated electronic circuit according to the present invention is illustrated in FIGS. 3A and 3B, where it is seen that circuit assembly 10c comprises an encapsulation 14d that is dimensioned and configured to have bosses 70 that protrude radially from the otherwise cylindrical exterior surface of encapsulation 14d and that are integral therewith rather than comprising separate structures. Encapsulation 14d therefore has a non-conforming configuration relative to an enclosure having a cylindrical interior surface. Bosses 70 contact the interior surface of the enclosure and there is a gap between most, if not all, of the remainder of encapsulation 14d and the interior surface of the enclosure, thus establishing limited axial contact between them. Circuit assembly 10b comprises input leads 56 (FIG. 3A) that protrude axially from encapsulation 14d at the input end of circuit assembly 10b to permit the electrical components therein to be operatively connected to external electrical components. As seen in FIG. 3A, encapsulation 14d defines scallops 50 to provide access to leads 52 without requiring that the leads protrude beyond the surface profile of encapsulation 14d, just as does the embodiment of FIGS. 2A, 2B and 2C. FIG. 3B illustrates that bosses 70 bear against the interior surface of a cylindrical enclosure such as sleeve 22 leaving a gap between the rest of the interior surface of the sleeve 22 and the remainder of the encapsulation, giving the encapsulation a non-conforming configuration relative to the sleeve. As indicated by shock wave dispersion lines 72, bosses 70 disperse shock waves indicated at 74 that impinge on the enclosure, i.e., sleeve 22, and that are transferred to encapsulation 14d.

As indicated above, in preferred embodiments of the present invention, the circuit encased by the encapsulation comprises a control circuit, for use in a detonator, which can operate with either an electric or non-electric initiation signal means. For example, an electrical initiation signal line may be connected to input leads 56 (FIG. 3A) from a remote source controlled by a user to provide an initiation signal to a suitably configured circuit assembly. Alternatively, the circuit assembly may be used with a non-electric initiation signal means, e.g., for use with a detonating cord, shock tube, etc., provided that there is provided at least a transducer to convert the non-electric initiation signal to an electrical signal that can be used to initiate the circuit assembly. The term "initiation signal lines", as used herein and in the claims, is meant to encompass electrical initiation signal transmission lines as well as non-electric initiation signal transmission lines and their associated transducers for delivering an electrical initiation signal to the input leads of the circuit assembly of this invention.

Figure 4:
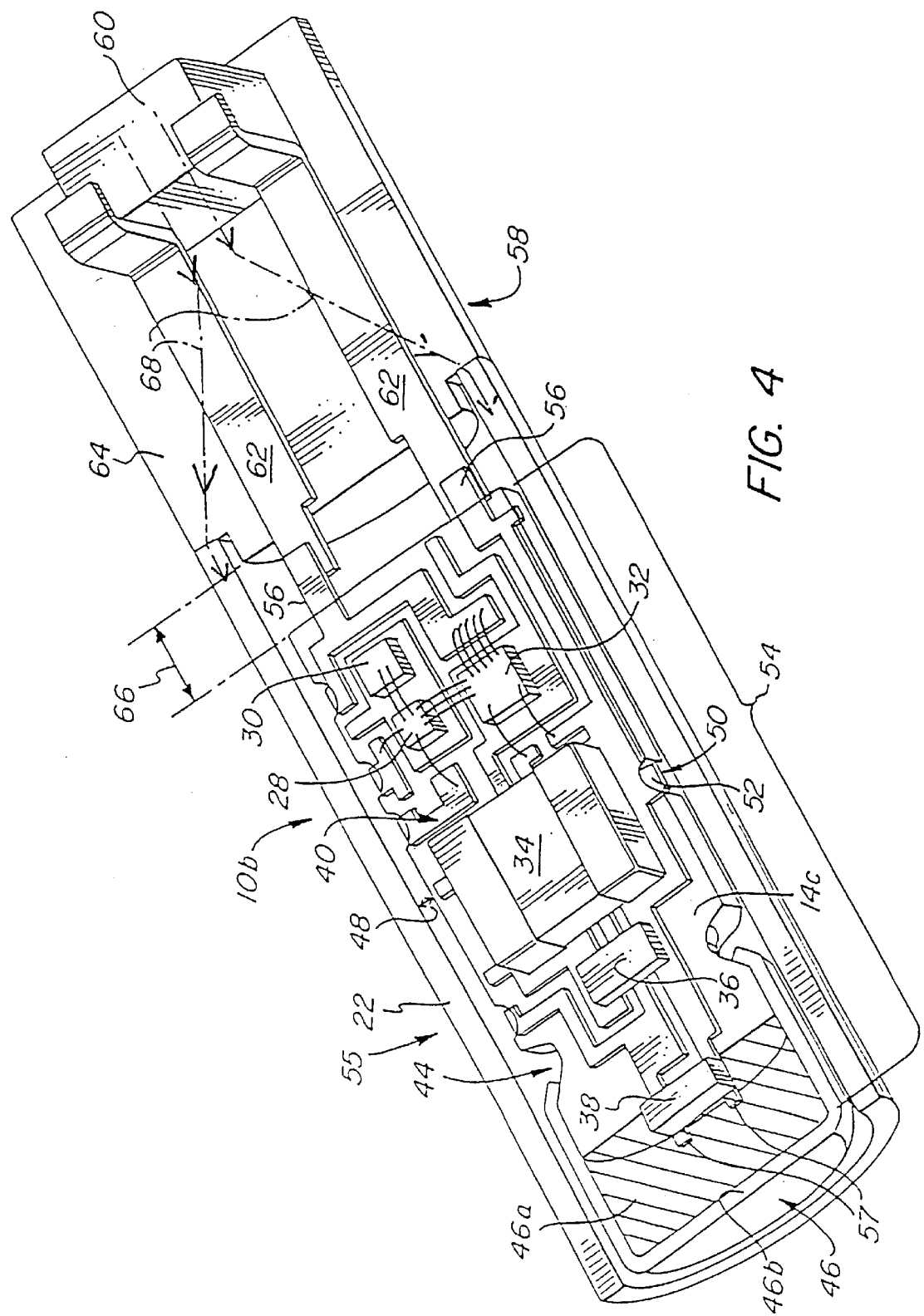
FIG. 4 is a partly cross-sectional perspective view of a sheathed initiator assembly comprising the initiation module and sleeve of FIG. 2C together with a transducer module.

FIG. 4 provides a perspective view of a sheathed initiator assembly 55 in accordance with the present invention. Initiator assembly 55 comprises an initiation module 54 and a transfer member 58. Initiation module 54 comprises the circuit assembly 10b and an initiation output cap 46 mounted thereon. The circuit assembly 10b comprises a circuit encased in an encapsulation 14c, the circuit comprising various circuit components such as an integrated timer circuit 28, a timer resistor 30, an integrated switching circuit 32, a storage capacitor 34, and a bleeder resistor 36, mounted on lattice-like portions of a carrier comprising lead frame 40. The circuit assembly 10b is disposed within an elongate enclosure comprising a sleeve 22 having an axially-extending interior surface. Sleeve 22 is sized for a telescoping fit inside a standard detonator shell. Input leads 56 protrude from encapsulation 14c at the input end of circuit assembly 10b so they can be welded or soldered to leads 62 on transfer member 58, and output leads 57 protrude from encapsulation 14c at the output end of circuit assembly 10b. The axial length of the circuit assembly 10b is the distance from the input end to the output end.

The initiation output cap 46 of initiation module 54 comprises an electrical initiation element such as a semiconductor bridge ("SCB") 38 or, alternatively, a hot wire, exploding bridgewire, thin film bridge, etc., connected to output leads 57, an initiation charge 46a which preferably comprises a secondary explosive material or a suitable substitute therefor such as tetraammine-cis-bis (5-nitro-2H-tetrazolato-$N^2$) cobalt (III) perchlorate ("BNCP"), certain primary explosives and energetic mixes such as zirconium potassium perchlorate, and an initiation shell 46b that is crimped onto neck region 44 and which holds initiation charge 46a in energy transfer relation to semiconductor bridge 38. The explosive output initiation signal provided by the initiation output cap 46 may be used, e.g., to initiate the base charge or "output" charge of a detonator within which assembly 55 is disposed, and may thus comprise part of the output means for the detonator, as described below with reference to FIG. 6A. The circuitry in circuit assembly 10b provides a delay between the receipt of an impulse at transfer member 58 and the initiation of SCB 38. The signal transfer member 58 may simply comprise a plug with electrical lead wires passing therethrough to permit the transfer of an electrical initiation signal through the plug from an electrical signal transmission line. In the illustrated embodiment, however, the initiation signal transfer member comprises a transducer, e.g., a piezoelectric transducer 60, for converting a physical impulse signal into an electrical signal. Thus, when an initiation signal in the form of a physical impulse is received at signal transfer member 58, it is converted into an electrical signal and conveyed via transfer leads 62 to input leads 56 of the circuit assembly 10b. The flat end of initiation shell 46b is at the output end of initiation module 54 while the input end of initiation module 54 coincides with the input end of circuit assembly 10b. The axial length of initiation module 54 extends from the input end to the output end thereof.

Encapsulation 14c is configured as shown in FIGS. 2A and 2B and so has fins 24 (which are not visible in FIG. 4 but are seen, e.g., in FIGS. 2A, 2B and 2C) that bear against sleeve 22 and that establish a gap 48 (FIG. 4) between axially co-extensive portions of encapsulation 14c and sleeve 22 between initiation output cap 46 and transfer member 58. As indicated above, encapsulation 14c defines scallops 50 where test or program leads 52 can be accessed through encapsulation 14c so that the circuit therein can be programmed and/or tested prior to assembly of the detonator. Scallops 50 preferably allow the lead to remain within the surface profile of encapsulation 14c, i.e., the leads preferably do not extend into gap 48. Scallops 50 may be omitted provided the test leads do not protrude from encapsulation 14c farther than the fins so that they do not extend across gap 48 to contact the surrounding enclosure. Thus, initiation module 54 can be inserted into sleeve 22 and leads 52 will not contact sleeve 22.

Upon receipt of an impulse, transducer 60 produces an electrical pulse that is delivered to input leads 56 of circuit assembly 10b via transfer leads 62. Transducer bushing 64 is dimensioned and configured to engage sleeve 22 so that transfer member 58 can be secured onto the end of sleeve 22 with leads 62 in contact with input leads 56. Initiation module 54, sleeve 22 and transfer member 58 are dimensioned and configured so that, when assembled as shown in FIG. 4, an air gap indicated at 66 is established between initiation module 54 and transfer member 58. In this way, initiation module 54 is at least partially shielded from the shock wave that causes piezoelectric transducer 60 to create the electrical pulse for the circuit assembly. The pressure imposed by such shock wave is transferred through transfer member 58 onto sleeve 22, as indicated by force arrows 68, rather than onto initiation module 54.

Figure 5A:
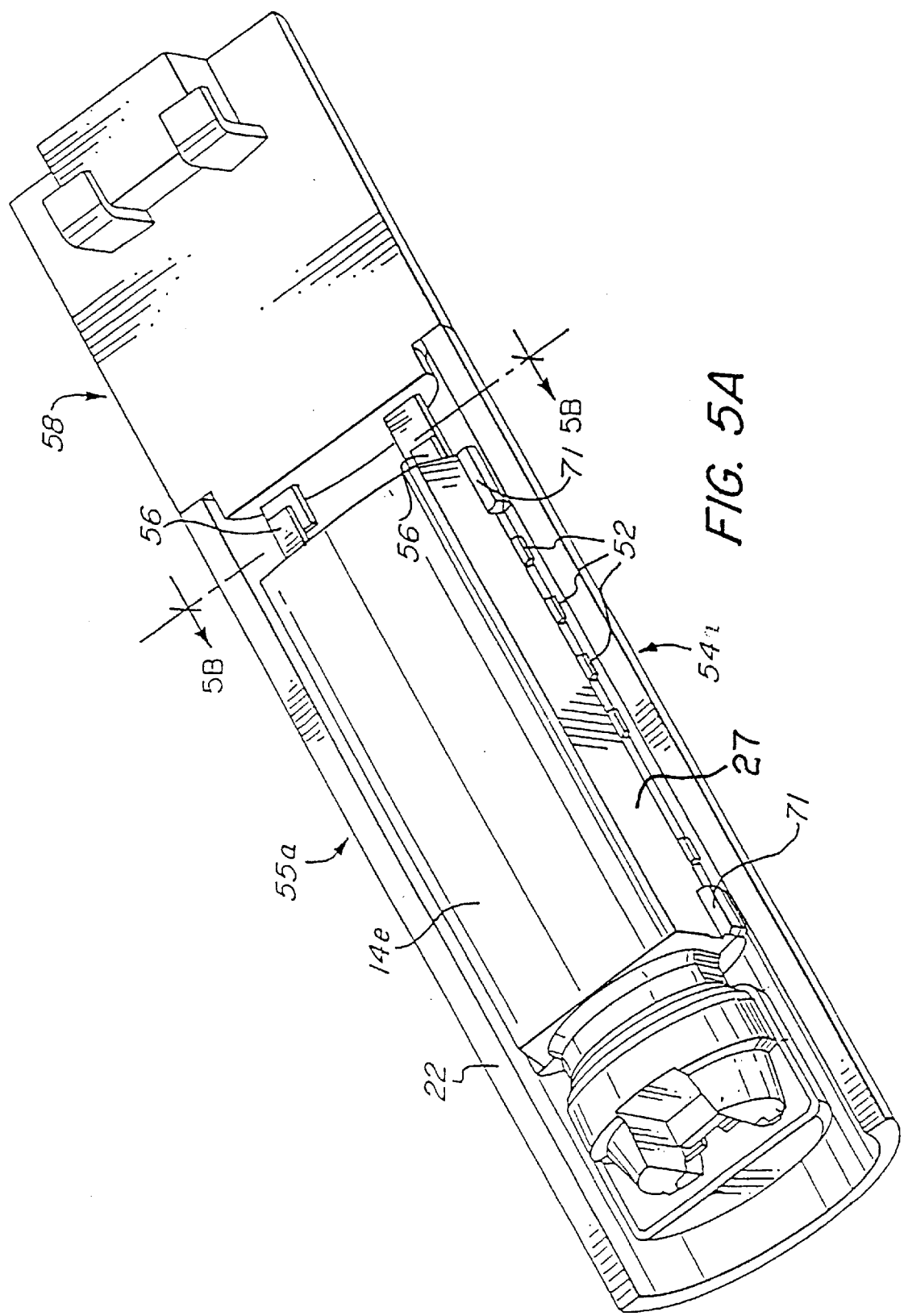
FIG. 5A is a view similar to FIG. 4 of an alternative embodiment of the invention.
Figure 5B:
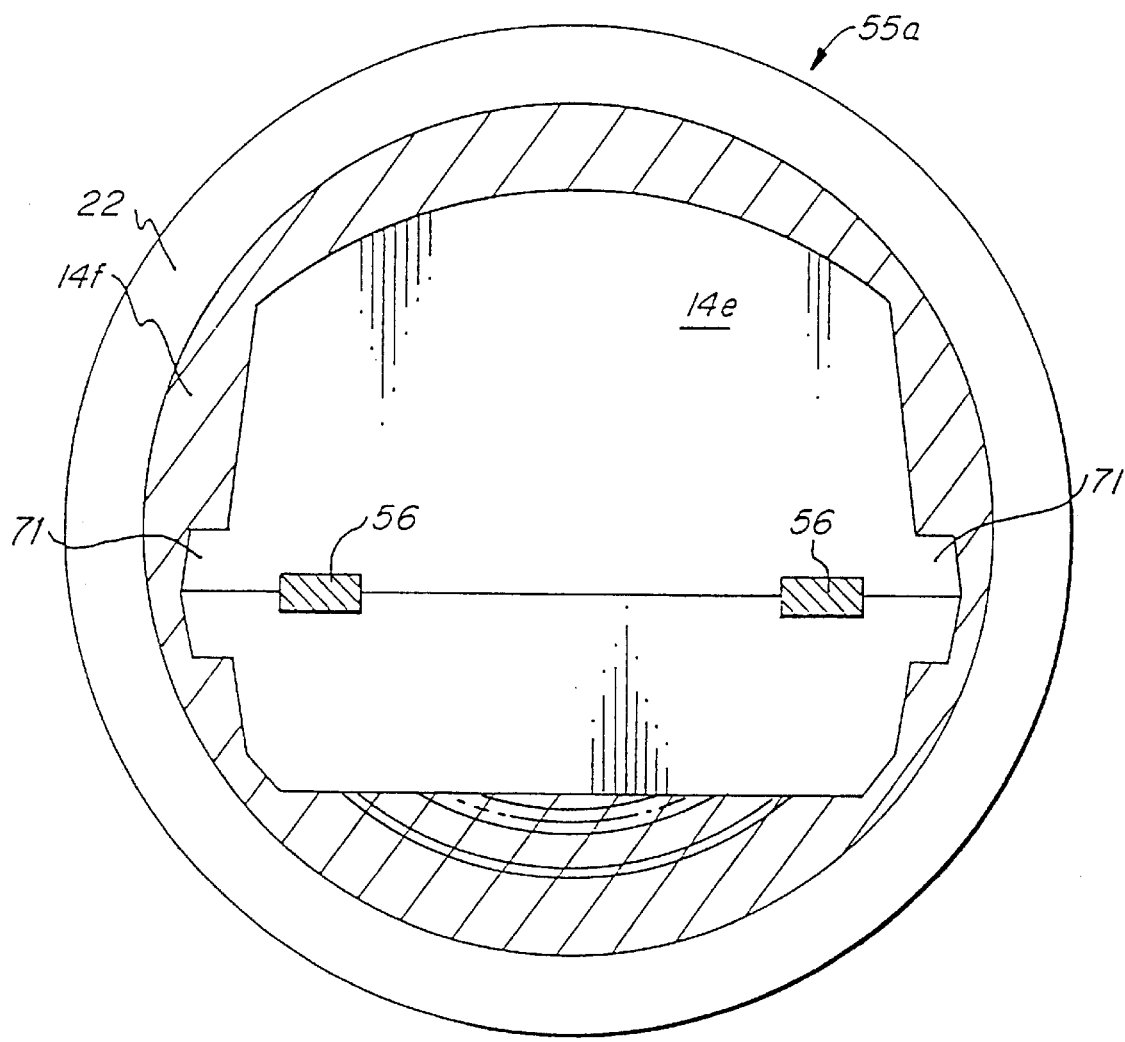
FIG. 5B is a partly cross-sectional view of the sheathed initiator assembly of FIG. 5A taken along line 5B—5B of FIG. 5A.

FIGS. 5A and 5B illustrate a sheathed initiator assembly 55a according to an alternative embodiment of the invention in which the encapsulation for the electronic circuit is not configured for limited contact with the enclosure. In this embodiment, the encapsulation comprises a casing for the electronic components and the carrier. The casing 14e comprises a structural support material and a decoupling material 14f, shown only in FIG. 5B. Generally, the structural support material of casing 14e should have a Young's Modulus of at least about $5 \times 10^5$ psi and preferably has a Young's Modulus in the range of from about $1 \times 10^6$ psi to about $40 \times 10^6$ psi. Preferably, the structural support material has a strength of at least about 5000 psi and a coefficient of thermal expansion that matches that of the integrated circuit components therein. Casing 14e may comprise, e.g., a glass-filled epoxy casing 14e that has, when cured, a density of at least about 1 gram per cubic centimeter (g/cc) and a Young's Modulus of $1 \times 10^6$ psi. Such an epoxy material is available from Sumitomo Corporation under the designation Resin No. 6300 and is stated to be 60 percent glass-filled. Casing 14e is sufficiently rigid when cured to provide structural support to the circuit and help prevent damage to the circuit from inadvertent bending. As seen in FIG. 5A, casing 14e is generally rectangular in configuration and is configured to have substantially smooth sides 27 from which the leads 52 protrude. To prevent leads 52 from bearing against the electrically conductive sleeve 22 and thus possibly short-circuiting the electronic circuit therein, casing 14e is configured to define stand-offs 71 which protrude from sides 27 of casing 14e further than leads 52. Thus, should casing 14e come into contact with sleeve 22 during assembly, stand-offs 71 will prevent the leads 52 from engaging the interior surface of the sleeve 22.

Casing 14e may be dimensioned and configured for limited longitudinal contact with the interior surface of sleeve 22 as described above, e.g., in relation to FIGS. 1A and 1B, but casing 14e is preferably dimensioned and configured as suggested in FIG. 5B so that when centered within sleeve 22 it does not make direct contact with the interior surface thereof. In the illustrated embodiment, the space between the casing 14e and sleeve 22 is substantially wholly filled by a shock-absorbing, decoupling material 14f of the encapsulation. In a particular embodiment of the invention, decoupling material 14f has a density of only 0.8 g/cc and a Young's Modulus of 5000 psi and thus differs significantly from the glass-filled epoxy of casing 14e. The decoupling material may comprise an elastic polymeric material, e.g., a silicone, and may optionally be formed as a foam. A decoupling material comprising a swatch of foam padding may be adhered to casing 14e to engage the interior surface of the sleeve. However, it is expected that a more suitable method for disposing a decoupling material of the encapsulation between a structural support material and the enclosure will comprise injecting foamed polymeric decoupling material into the space between them, e.g., in the space between the epoxy casing 14e and sleeve 22. The decoupling material between the sleeve and the circuit within the encapsulation serves to attenuate the force of shock waves that may be transmitted from the surroundings of the circuit, and thus protects the circuit. This protective effect is attained without the need to limit contact between the decoupling material 14f and the interior of the enclosure, but the protective effect is enhanced when the decoupling material is physically configured for limited contact with the enclosure as described above with reference to FIGS. 1A through 3B. The protective function of the encapsulation is further enhanced because, as suggested above, casing 14e is dimensioned and configured so that it defines a non-uniform offset from the cylindrical interior surface of sleeve 22. Such a configuration of the structural support encapsulation material is encompassed by the term "non-conforming configuration". Specifically, casing 14e is substantially rectangular, and is therefore cylindrically protuberant even though it does not directly engage the interior surface of sleeve 22. Accordingly, for example, the distance between one edge of casing 14e and the interior surface of sleeve 22, represented as offset $S_1$, is significantly shorter than the distance between a point on the side of casing 14e and the interior surface of sleeve 22, represented as $S_2$. Any remnants of a shock wave received by casing 14e will be dissipated by its irregular configuration relative to sleeve 22 before it encounters the circuit within. Other cylindrically protuberant configurations for casing 14e will, likewise, enhance the protective function of the encapsulation.

Figure 5C:
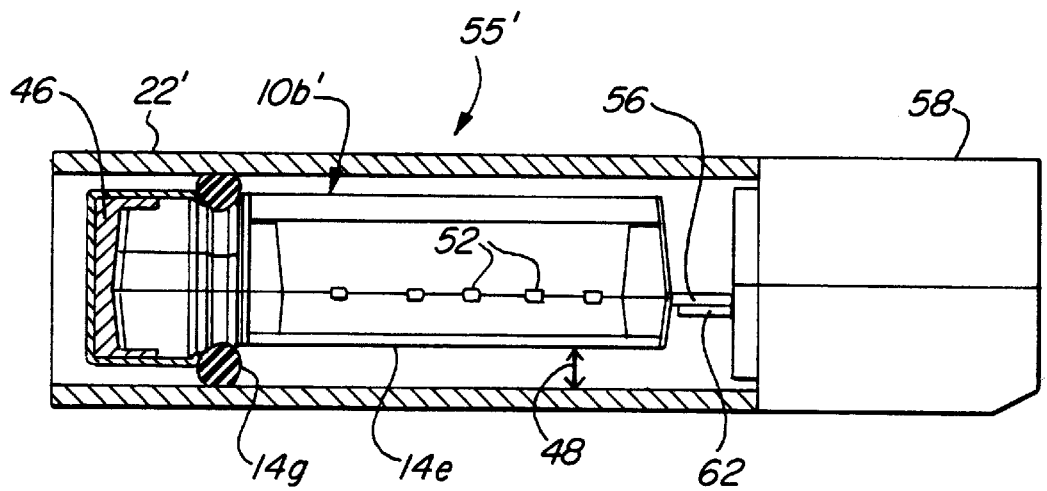
FIG. 5C is a partly cross-sectional plan view of still another embodiment of the present invention.

FIG. 5C illustrates yet another embodiment of the present invention comprising a sheathed initiator assembly 55' which comprises a circuit assembly 10b' and a transfer member 58. The circuit assembly 10b' comprises the same internal circuitry described above relative to circuit assembly 10b of FIG. 4. Circuit assembly 10b' has an initiation cap 46 secured thereto and is connected to transfer member 58 in the same manner as for circuit assembly 10b of FIG. 4. The encapsulation of circuit assembly 10b' comprises the epoxy-based casing material 14e described above in connection with FIG. 5B and, as with the embodiment of FIG. 5B, casing 14e is dimensioned and configured so that it can be centered within sleeve 22' without contacting the interior structure thereof. However, instead of a decoupling material that is axially co-extensive with the casing 14e and that fills the axial gap between casing 14e and the surrounding enclosure, the encapsulation of circuit assembly 10b' comprises a bushing 14g disposed about casing 14e in the space between casing 14e and sleeve 22'. Typically, the bushing will occupy less than fifty percent of the axial length of the circuit assembly 10b' along the axis of sleeve 22', more typically, less than twenty-five percent of the axial length of circuit assembly 10b'. Preferably, the bushing is disposed closer to the end of circuit assembly 10b' opposite from input leads 56 than it is to leads 56, e.g., it is closer to output leads 57 than to input leads 56. Since the initiation output cap 46 is typically at the opposite end of the circuit assembly 10b' from the input leads, it can be said that the bushing is typically closer to initiation output cap 46 than to the input leads. Simply put, the bushing is disposed proximally to the output end of circuit assembly 10b' rather than proximally to the input end. The bushing and casing 14e are dimensioned and configured so that the outer circumferential surface of the bushing exceeds the axial profile of the casing 14e and initiation output cap 46. As a result, the bushing is the only portion of the encapsulation that bears against the longitudinal interior surface of sleeve 22' when circuit assembly 10b' is centrally disposed in sleeve 22'. The encapsulation of the circuit thus has a non-conforming configuration relative to the sleeve enclosure.

One end of the circuit assembly 10b' is suspended centrally within the sleeve 22' by virtue of the connection between input leads 56 and transfer leads 62, leaving a generally annular radial gap 48 between casing 14e and sleeve 22' in the area near input leads 56. The circuit assembly 10b' is further supported within sleeve 22' by the bushing 14g that comprises part of the circuit encapsulation. Optionally, the bushing, which is preferably elastic or resilient in character, makes uninterrupted circumferential contact with the interior surface of sleeve 22' within that portion of sleeve 22' in which the bushing and the sleeve are axially co-extensive, and the bushing may therefore optionally have a configuration that conforms to the interior surface of sleeve 22', rather than a non-conforming configuration. Even in this case, however, the entire encapsulation still establishes limited contact with sleeve 22' because casing 14e does not contact sleeve 22' at any point. Preferably, the bushing comprises a vibration decoupling material.

In a particular commercial embodiment, bushing 14g comprises an O-ring. The O-ring may be formed from a polymeric elastic material having a durometer in the range of 60–70. One particular O-ring found to be suitable for this purpose is formed from buna N rubber (a well-known synthetic nitrile rubber) and is coated with a finish comprising polytetrafluoroethylene (PTFE). A variety of other synthetic materials (e.g., neoprenes, butyl rubber, etc.) can also be used as well for the O-ring. In a specific embodiment, an O-ring made of buna-N having a durometer of 70, an inner diameter of 0.126 inch and a thickness of about 0.41 inch is disposed about a circuit encapsulation in a neck region having an oblong cross-sectional periphery with a dimension of about 0.135 inch along the major axis, for insertion into a cylindrical sleeve having an interior diameter of 0.212 inch. Preferably, casing 14e defines a neck region 44 where bushing 14g can be seated and which can facilitate the attachment of the initiation output cap 46 to casing 14e in a crimping process, as described above. Preferably, the circuit is configured so that there are no circuit elements (resistor, capacitor, integrated circuit chips, etc.) other than conductive leads in the axial region of circuit assembly 10b' about which bushing 14g is positioned, i.e., that which corresponds to neck region 44 of the embodiment of FIG. 4. That way, any vibrations that do pass through bushing 14g will not directly impinge on vulnerable circuit elements. The illustrated sheathed initiator assembly 55' can be installed in a detonator housing or shell as described below in relation to FIG. 6 and serves to release an initiation impulse from the initiation output cap that initiates the output charge of the detonator upon receipt of the initiation signal from a signal transfer line. Sleeve 22' is configured for a telescoping fit within a standard sized detonator shell or housing. Such shells are typically made from metal and are vulnerable to crushing under forces commonly encountered in blasting environments, e.g., as a result of collapsed rock formations, the transmission of shock waves, etc., e.g., to forces of about 500 pounds per square inch (psi). One feature of the present invention is that sleeve 22' is formed from hardened steel and is configured so that when disposed within such a detonator shell, the two provide adequate crush resistance to protect the contents therein against forces of at least about 10,000 psi or greater, preferably about 14,000 psi or 15,000 psi.

Figure 5D:
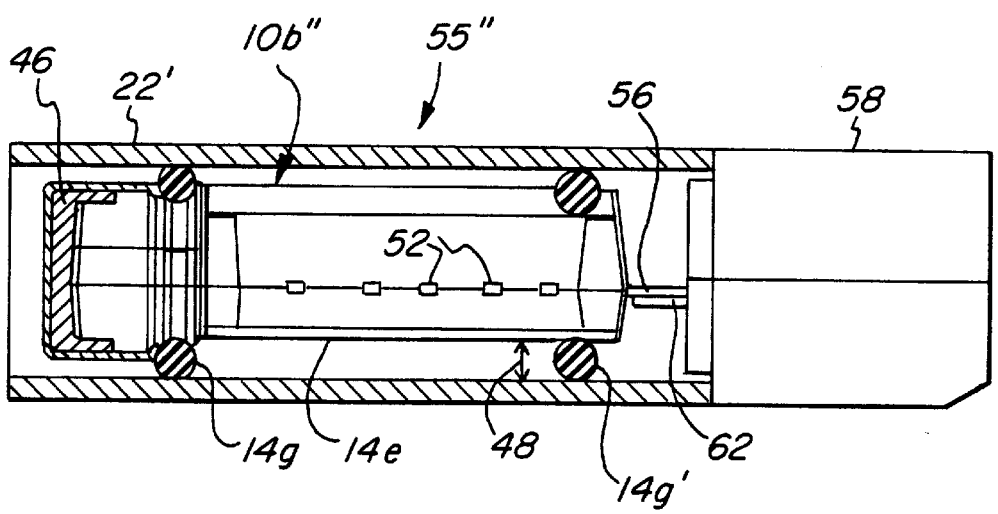
FIG. 5D is a view similar to FIG. 5C of yet another embodiment of the present invention.

Optionally, the circuit assembly may be equipped with more than one bushing, as illustrated in FIG. 5D by sheathed initiator assembly 55". Optionally but preferably, in such case, at least one bushing is disposed proximally to the input end of the circuit assembly and another is disposed proximally to the output end, as illustrated in FIG. 5D by sheathed initiator assembly 55". Assembly 55" is configured in generally the same manner as the sheathed initiator assembly 55' of FIG. 5C, so corresponding structures are shown with corresponding identifying numerals, and the description of assembly 55" only addresses the differences with respect to assembly 55' of FIG. 5C. Sheathed initiator assembly 55" differs from assembly 55' of FIG. 5C in that circuit assembly 10b" is configured to seat two bushings, 14g and 14g'. Together the bushings occupy less than fifty percent of the axial length of the circuit assembly 10b" along the axis of sleeve 22', each preferably occupying less than twenty-five percent of the axial length of circuit assembly 10b". One bushing (e.g., 14g) is disposed proximally to the output end of circuit assembly 10b" while the other busing (14g') is disposed proximally to the input end. As with assembly 55' of FIG. 5C, the bushings are optionally but preferably the only portion of the encapsulation that bears against the longitudinal interior surface of sleeve 22' when circuit assembly 10b" is centrally disposed in sleeve 22'. The encapsulation of the circuit thus has a non-conforming configuration relative to the sleeve enclosure that suspends the circuit assembly 10b" centrally within the sleeve without relying on the connection between input leads 56 and transfer leads 62. The bushings may be made from the same or different materials and may be configured similarly or differently from each other. Even with two bushings, the entire encapsulation still establishes limited contact with sleeve 22' because casing 14e does not contact sleeve 22' at any point. Preferably, the circuit is configured so that there are no circuit elements (resistor, capacitor, integrated circuit chips, etc.) other than conductive input or output leads in the axial region of circuit assembly 10b" about which the bushings are positioned.

Referring now to FIG. 6A there is shown a digital delay detonator comprising a circuit assembly in accordance with one embodiment of the present invention. Broadly speaking, detonator 100 is superficially similar to detonators known in the art as "detonators" or sometimes "detonator caps", which typically comprise a small charge of explosive material disposed in a metal or plastic housing 140. The detonator cap is connected to a signal transmission line such as shock tube 110. A signal that can result in the initiation of the explosive charge in the housing can be received via the signal transmission line. The term "detonator" is generally understood to refer to the housing with the explosive charge therein (together with supporting structures, chemical and/or electronic delay means, transducers and the like that are needed to deliver and time the initiation of the explosive output) but does not include extraneous structures external to the housing. For example, the Dewar vessel shown in the U.S. Patent to Gessel, mentioned above, contains a detonator but is not part of the detonator.

In the illustrated embodiment, delay detonator 100 comprises an initiation signal means comprising a non-electric signal transmission line which comprises, in the illustrated case, a shock tube 110, adapter bushing 114, isolation cup 118, booster charge 120 and transfer member 58. As is well-known to those skilled in the art, shock tube comprises hollow plastic tubing, the inside wall of which is coated with an explosive material so that, upon ignition, a low energy shock wave is propagated through the tube. See, for example, Thureson et al, U.S. Pat. No. 4,607,573. (It will be understood that other non-electric signal transmission lines such as detonating cord, low energy detonating cord, low velocity shock tube and the like may be used in place of shock tube.) Shock tube 110 is secured in the open end 112a of an enclosure comprising a housing 112 by an adapter bushing 114 about which housing 112 is crimped at crimps 116, 116a. Bushing 114 also helps to form an environmentally protective seal between housing 112 and the outer surface of shock tube 110. Housing 112 is made of an electrically conductive material, usually aluminum, and is preferably the size and shape of conventional blasting caps, i.e., detonators. A segment 110a of shock tube 110 within housing 112 terminates at end 110b in close proximity to, or in abutting contact with, an anti-static isolation cup 118.

Isolation cup 118, as best seen in FIG. 6B, is of a type well-known in the art and is made of a semiconductive material, e.g., a carbon-filled polymeric material, so that it forms a path to housing 112 to dissipate any static electricity which may travel along shock tube 110. For example, see Gladden U.S. Pat. No. 3,981,240. A low energy booster charge 120 is positioned adjacent to isolation cup 118 and in signal communicating relationship with end 110b of shock tube 110. As best seen in FIG. 6B and as is well-known in the art, isolation cup 118 comprises a generally cylindrical body (usually in the form of a truncated cone disposed with the larger diameter positioned towards the open end 112a of housing 112), the interior of which is divided by a thin, rupturable membrane 118b into an entry chamber 118a and an exit chamber 118c. The end 110b of shock tube 110 (FIG. 6A) may be received within entry chamber 118a (shock tube 110 is not shown in FIG. 6B for clarity of illustration). Exit chamber 118c provides an air space or stand-off between the end 11b of shock tube 110 and booster charge 120. In operation, the shock wave signal traveling through shock tube 110 will rupture membrane 118b and traverse the stand-off provided by exit chamber 118c and impinge upon and detonate booster charge 120.

Booster charge 120 comprises a small quantity of explosive 124, upon which is disposed a first cushion element 126. Explosive 124 typically comprises a primary explosive such as lead azide, but may comprise a suitable secondary explosive, e.g., BNCP. A first cushion element 126, which is annular in shape save for a thin central membrane, is disposed between isolation cup 118 and explosive 124 to bear the tamping pressure with which explosive 124 is pressed during manufacture of detonator 100, to protect explosive 124 from the direct application of pressure.

Isolation cup 118, first cushion element 126, and booster charge 120 may conveniently be fitted into a booster shell 132 as shown in FIG. 5B. The outer surface of isolation cup 118 is in conductive contact with the inner surface of booster shell 132, which in turn is dimensioned and configured to have a friction fit with the interior of housing 112, and thus provides a path of electrical conductivity from shock tube 110 to housing 112. Generally, booster shell 132 is inserted into housing 112 and housing 112 is crimped to retain booster shell 132 therein as well as to protect the contents of housing 112 from the environment.

A non-conductive buffer 128, which is typically 0.015 inch thick, is located between booster charge 120 and a transfer member 58 to electrically isolate transfer member 58 from booster charge 120. Transfer member 58 comprises a piezoelectric transducer that is disposed in force-communicating relationship with booster charge 120 and so can convert the output force of booster charge 120 to a pulse of electrical energy. The output leads of transfer member 58 are connected to initiation module 54 as shown in FIG. 4. As illustrated in FIG. 5, the enclosure provided by detonator 100 comprises housing 112 and an optional open-ended steel sleeve 22 therein that encloses initiation module 54 and that is configured to have a friction fit with the interior of housing 112.

Detonator 100 comprises an output means to produce a detonation output signal at the end of the delay interval. As indicated above, part of the detonator output means comprises the initiation output cap 46 of initiation module 54 (shown in FIG. 4), adjacent to which in detonator 100 is a second cushion element 142, which is similar to first cushion element 126. Second cushion element 142 separates the output initiation means of initiation module 54 from the remainder of the detonator output means comprising output charge 144 disposed at the closed end 112b of housing 112. Output charge 144 comprises an optional primary explosive 144a (for which a suitable secondary explosive material, e.g., BNCP, may be substituted) and a secondary explosive 144b. The secondary explosive 144b has sufficient shock power to rupture housing 112 and detonate cast booster explosives, dynamite, etc., disposed in signal transfer proximity to detonator 100.

In use, a non-electric initiation signal in the initiation signal means travels through shock tube 110 and is emitted at end 110b. The signal ruptures membrane 118b of isolation cup 118 and first cushion element 126 to initiate explosive 124 of booster charge 120. Explosive 124 generates a detonation shock wave that bears on the piezoelectric transducer in transfer member 58. Transfer member 58 then produces a pulse of electrical energy that is received by initiation module 54. Thus, the non-electric initiation signal means delivers an initiation signal to the circuit assembly of initiation module 54. The circuit assembly stores the pulse of electric energy and, after a predetermined delay, releases or conveys the energy to the output initiation means which initiates output charge 144.

As indicated above, in alternative embodiments, the encapsulated circuit assembly of the present invention may be used with an electric detonator delay circuit designed for use with an electric signal transmission wire instead of a shock tube or other non-electric signal transmission line. In such a circuit, of course, there would be no need for a booster charge 120 or a transfer member 58.

While the invention has been described in detail with reference to particular embodiments thereof, it will be apparent that upon a reading and understanding of the foregoing, numerous alterations to the described embodiments will occur to those skilled in the art. For example, it will be understood that even if the enclosure does not have a cylindrical interior surface, the configuration of the circuit encapsulation can be adapted for limited contact therewith. It is intended to include such alterations within the scope of the appended claims.

What is claimed is:

1. A sheathed electronic circuit assembly comprising an electronic circuit encased in an encapsulation and disposed within an elongate enclosure having a longitudinally-extending interior surface, wherein the encapsulation is dimensioned and configured for contact with less than 50 percent of the longitudinally-extending interior surface that is co-extensive with the encapsulation.

2. The circuit assembly of claim 1 wherein the enclosure comprises a metal sleeve.

3. The circuit assembly of claim 2 wherein the circuit comprises input and output leads that protrude from the encapsulation, wherein the assembly further comprises a transfer member at one end of the enclosure.

4. The circuit assembly of claim 3 wherein the encapsulation comprises a casing that encases the circuit and at least one bushing that contacts the longitudinal interior surface of the enclosure and which occupies less than fifty percent of the axial length of the casing.

5. A sheathed electronic circuit assembly comprising an electronic circuit encased in an encapsulation and disposed within an elongate enclosure having a longitudinally-extending interior surface, wherein the encapsulation is dimensioned and configured for limited axial contact with the longitudinally-extending interior surface;

wherein the enclosure comprises a metal sleeve;

wherein the circuit comprises input and output leads that protrude from the encapsulation, wherein the assembly further comprises a transfer member at one end of the enclosure;

wherein the encapsulation comprises a casing that encases the circuit and at least one bushing that contacts the longitudinal interior surface of the enclosure and which occupies less than fifty percent of the axial length of the casing; and wherein the bushing comprises an O-ring.

6. The circuit assembly of claim 4 or claim 5 comprising two or more bushings.

7. The circuit assembly of claim 6 wherein the current assembly has an output end and an input end and wherein one bushing is disposed proximally to the output end and another bushing is disposed proximally to the input end.

8. A sheathed electronic circuit assembly comprising an electronic circuit encased in an encapsulation and disposed within an elongate enclosure having a longitudinally-extending interior surface, wherein the encapsulation is dimensioned and configured for limited axial contact with the longitudinally-extending interior surface, and wherein the encapsulation is configured to define a plurality of radially-protruding bosses formed integrally therewith.

9. An initiator assembly comprising:

an elongate, open-ended enclosure having a longitudinal interior surface;

an initiation module comprising a circuit assembly with an initiation output cap secured thereto, the initiation output cap comprising an electrical initiation element and an initiation charge in a cap that is secured to the circuit assembly, the circuit assembly comprising a circuit encased within an encapsulation which is disposed within the enclosure, the circuit having input leads that protrude from the encapsulation for receiving an electric initiation signal and output leads connected to the electrical initiation element in the initiation cap, the circuit being configured to initiate the initiation output cap in response to an electric initiation signal received at the input leads;

wherein the encapsulation further comprises at least one elastic bushing occupying less than one-half of the axial length of the encapsulation, the bushing being positioned and configured to contact the interior surface of the enclosure and to have a periphery that exceeds the axial profile of the remainder of the initiation module so that the circuit encapsulation has a non-conforming configuration relative to the interior surface of the enclosure.

10. The assembly of claim 9 further comprising a transfer member comprising a body portion and transfer leads for delivering an initiation signal through the body portion to the transfer leads, the transfer member being coupled to the enclosure with the transfer leads extending therein and being connected to the circuit input leads, wherein the bushing and the transfer leads cooperate to position the circuit assembly in the sleeve without contact between the circuit casing and the interior sleeve surface.

11. The assembly of claim 9 wherein the bushing occupies less than one-quarter the axial length of the circuit assembly.

12. An initiator assembly comprising:
an elongate, open-ended enclosure having a longitudinal interior surface;
an initiation module comprising a circuit assembly with an initiation output cap secured thereto, the initiation output cap comprising an electrical initiation element and an initiation charge in a cap that is secured to the circuit assembly, the circuit assembly comprising a circuit encased within an encapsulation which is disposed within the enclosure, the circuit having input leads that protrude from the encapsulation for receiving an electric initiation signal and output leads connected to the electrical initiation element in the initiation cap, the circuit being configured to initiate the initiation output cap in response to an electric initiation signal received at the input leads;
wherein the encapsulation further comprises two or more bushings that together occupy less than one-half of the axial length of the encapsulation, the bushings being positioned and configured to contact the interior surface of the enclosure and to have a peripheries that exceed the axial profile of the remainder of the initiation module so that the circuit encapsulation has a non-conforming configuration relative to the interior surface of the enclosure.

13. The assembly of claim 12 further comprising a transfer member comprising a body portion and transfer leads for delivering an initiation signal through the body portion to the transfer leads, the transfer member being coupled to the enclosure with the transfer leads extending therein and being connected to the circuit input lead.

14. The assembly of claim 9, claim 10, claim 12, or claim 13 wherein the initiation module has a first end from which the input leads protrude and a second end at the initiation cap, and wherein each bushing resides entirely between the first end and the second end of the initiation module.

15. The assembly of claim 14 wherein the circuit assembly comprises an input end and an output end and wherein the bushing resides entirely between the input end and the output end.

16. The assembly of claim 10 comprising a transfer member that converts a physical impulse into an electrical signal at the transfer leads.

17. The assembly of claim 9 or claim 12 wherein the sleeve comprises a metal sleeve.

18. The assembly of claim 17 wherein the sleeve comprises a metal sleeve configured to withstand a lateral pressure of at least 10,000 pounds per square inch (psi).

19. The assembly of claim 9 or claim 12 wherein at least one bushing comprises an O-ring.

20. The assembly of claim 19 wherein the initiation module defines at least one neck region within which an O-ring is seated.

21. The assembly of claim 19 wherein the O-ring comprises a polymeric material having a durometer in the range of from about 40 to 70.

22. A sheathed initiator assembly comprising:
an open-ended hardened steel sleeve having an interior sleeve surface and a sleeve axis therein;
a transducer member comprising a transducer body and transfer leads for receiving a physical impulse and generating an electrical signal at the transfer leads, the transducer member being coupled to one end of the sleeve with the transfer leads extending into the sleeve;
an initiation module comprising a circuit assembly with an initiation output cap secured thereto, the initiation output cap comprising an electrical initiation element and an initiation charge in a cap that is secured to the circuit assembly, the circuit assembly comprising a circuit in an encapsulation comprising a circuit casing and at least one resilient O-ring formed of a polymeric material configured for contact with the interior sleeve surface so that the bushing and the transfer leads cooperate to position the circuit assembly centrally in the sleeve without contact by the circuit casing with the interior sleeve surface, the circuit comprising a storage element and timed switching circuitry and having input leads protruding from the encapsulation for connection to the transfer leads for conveying an electric initiation signal from the transfer leads to the circuitry, the circuit assembly further comprising output leads to which the electric initiation element is connected.

23. The assembly of claim 22 wherein the transfer member comprises a transfer member that converts a physical impulse into an electrical signal at the transfer leads.

24. The assembly of claim 19 wherein the initiation module defines at least one neck region and wherein each O-ring is seated in a neck region.

25. A shock-resistant electronic circuit assembly comprising an electronic circuit encased in an encapsulation that is dimensioned and configured to define a plurality of bosses integral therewith that protrude from an otherwise cylindrical exterior surface;
wherein the electronic circuit comprises a delay circuit comprising
(i) storage means connected to an input terminal for receiving and storing electrical energy;
(ii) a switching circuit connecting the storage means to an output terminal for receiving and storing electrical energy;
(iii) an initiation element connected to the output terminal;
(iv) a timer circuit operatively connected to the switching circuit for controlling the release by the switching circuit of energy stored by the storage means to the initiation element,
wherein the input terminal extends through the encapsulation to permit delivery of electrical energy to the storage means from outside the encapsulation, and
wherein the output terminal protrudes from the encapsulation for delivering electrical energy from the storage means via the switching circuit to outside the encapsulation.

26. The circuit assembly of claim 8 wherein the enclosure comprises a metal sleeve.

27. The circuit assembly of claim 26 wherein the circuit comprises input and output leads that protrude from the encapsulation, wherein the assembly further comprises a transfer member at one end of the enclosure.

\* \* \* \* \*

UNITED STATES PATENT AND TRADEMARK OFFICE
CERTIFICATE OF CORRECTION

PATENT NO.    : 6,311,621 B1
DATED         : November 6, 2001
INVENTOR(S)   : P.N. Marshall et al.

It is certified that error appears in the above-identified patent and that said Letters Patent is hereby corrected as shown below:

Drawings,
Figure 1B, delete "14" and replace with -- 14b --

Column 3,
Line 21, after "further" delete "comprising" and insert therefor -- comprise --

Column 12,
Line 57, after "FIG" delete "6" and insert therefor -- 6A --

Column 13,
Line 25, after "other" delete "busing" and insert therefor -- bushing --

Column 14,
Line 39, after "end" delete "11b" and insert therefor -- 110b --
Line 54, after "cushion" delete "clement" and insert therefor -- element --

Signed and Sealed this

Sixth Day of July, 2004

JON W. DUDAS
*Acting Director of the United States Patent and Trademark Office*